US012690378B2

(12) United States Patent
Takenaka

(10) Patent No.: US 12,690,378 B2
(45) Date of Patent: Jul. 21, 2026

(54) METHOD FOR PRODUCING DISPLAY DEVICE, AND DISPLAY DEVICE

(71) Applicant: SHARP KABUSHIKI KAISHA, Sakai City (JP)

(72) Inventor: Yukio Takenaka, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 388 days.

(21) Appl. No.: 18/290,941

(22) PCT Filed: Sep. 3, 2021

(86) PCT No.: PCT/JP2021/032420
§ 371 (c)(1),
(2) Date: Jan. 22, 2024

(87) PCT Pub. No.: WO2023/032148
PCT Pub. Date: Mar. 9, 2023

(65) Prior Publication Data
US 2024/0431190 A1 Dec. 26, 2024

(51) Int. Cl.
*H10K 71/20* (2023.01)
*B82Y 20/00* (2011.01)
(Continued)

(52) U.S. Cl.
CPC ......... *H10K 71/211* (2023.02); *G03F 7/0751* (2013.01); *G03F 7/0755* (2013.01);
(Continued)

(58) Field of Classification Search
CPC .... H10K 71/211; H10K 71/20; H10K 71/421; H10K 71/40; H10K 71/12; H10K 50/115; H10K 50/112; H10K 50/16; H10K 50/805; H10K 50/18; H10K 77/10; G03F 7/0751; G03F 7/075; G03F 7/0755; G03F 7/085; H05B 33/10; H05B 33/14; H05B 33/12; H05B 33/02; B82Y 20/00; B82Y 40/00
See application file for complete search history.

(56) References Cited

FOREIGN PATENT DOCUMENTS

JP        2017-121787 A        7/2017

OTHER PUBLICATIONS

Takuma Igari et al., "Synthesis of Photodegradable Surface Modifiers Based on Phosphonic Acid for Introducing Functional Groups onto a Substrate and Application for Patterned Deposition of Gold Nano-Particulate Ink", Web Released: Feb. 26, 2019, 952 | Bull. Chem. Soc. Jpn. 2019, 92, 952-960 | doi:10.1246/bcsj.20180391.

(Continued)

*Primary Examiner* — Nikolay K Yushin
(74) *Attorney, Agent, or Firm* — ScienBiziP, P.C.

(57) ABSTRACT

A method for manufacturing a display device includes: applying a first solution containing (a) and (b) to a substrate containing an oxide, (a) a first functional group capable of being coordinated to the oxide, (b) a second functional group that is cleaved by being irradiated with ultraviolet light to generate any one of an amino group, a carboxyl group, a thiol group, and a selenol group; irradiating at least a part of the first solution applied to the substrate with first ultraviolet light; and applying a solution containing halogenated first quantum dots to a portion irradiated with the first ultraviolet light in the irradiating at least a part of the first solution applied to the substrate to form a first quantum dot layer.

10 Claims, 9 Drawing Sheets

FOURTH STEP                    FIFTH STEP

(51) Int. Cl.

| | |
|---|---|
| *B82Y 40/00* | (2011.01) |
| *G03F 7/075* | (2006.01) |
| *G03F 7/085* | (2006.01) |
| *H10K 50/115* | (2023.01) |
| *H10K 77/10* | (2023.01) |

(52) U.S. Cl.
CPC ........... *G03F 7/085* (2013.01); *H10K 50/115* (2023.02); *H10K 77/10* (2023.02); *B82Y 20/00* (2013.01); *B82Y 40/00* (2013.01)

(56) References Cited

OTHER PUBLICATIONS

Taehyung Kim et al., "Efficient and stable blue quantum dot light-emitting diode", Published online: Oct. 14, 2020, Nature, vol. 586, 385 to 389.

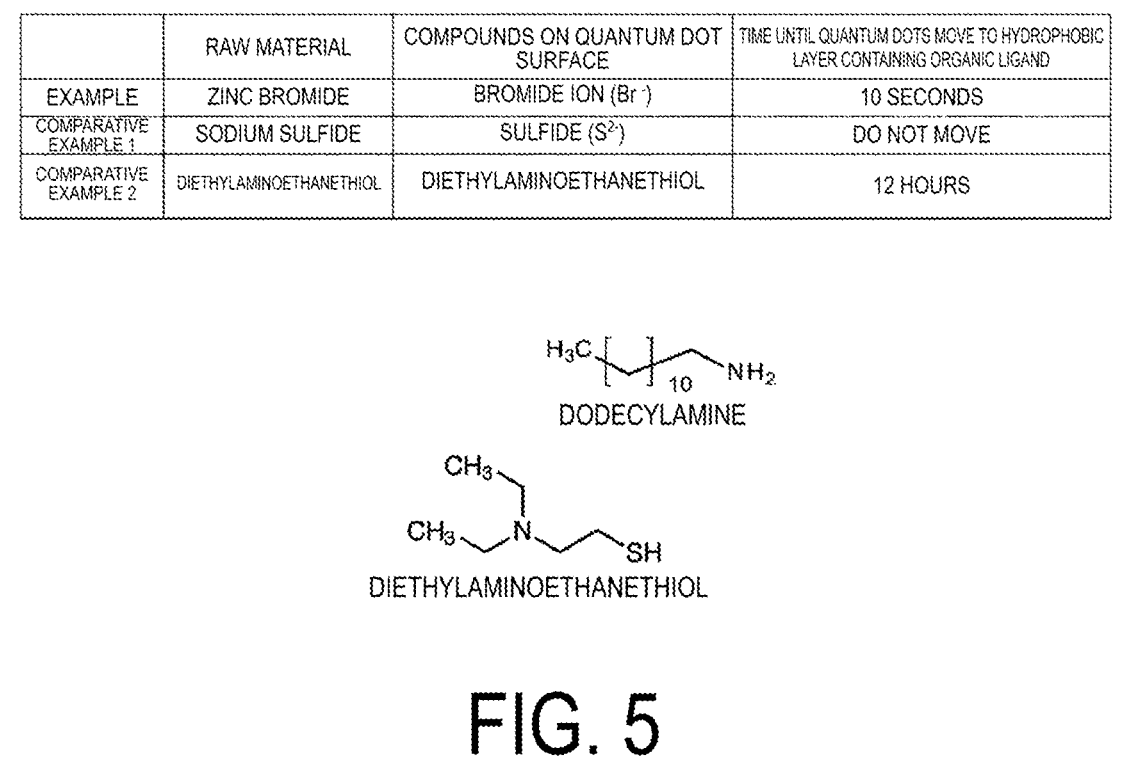

| | RAW MATERIAL | COMPOUNDS ON QUANTUM DOT SURFACE | TIME UNTIL QUANTUM DOTS MOVE TO HYDROPHOBIC LAYER CONTAINING ORGANIC LIGAND |
|---|---|---|---|
| EXAMPLE | ZINC BROMIDE | BROMIDE ION (Br⁻) | 10 SECONDS |
| COMPARATIVE EXAMPLE 1 | SODIUM SULFIDE | SULFIDE (S²⁻) | DO NOT MOVE |
| COMPARATIVE EXAMPLE 2 | DIETHYLAMINOETHANETHIOL | DIETHYLAMINOETHANETHIOL | 12 HOURS |

$$H_3C \underbrace{\phantom{-}}_{10} NH_2$$

DODECYLAMINE

DIETHYLAMINOETHANETHIOL

FIG. 5

METHOD FOR PRODUCING DISPLAY DEVICE, AND DISPLAY DEVICE

TECHNICAL FIELD

The disclosure relates to a method for manufacturing a display device and a display device.

BACKGROUND ART

It is known that a quantum dot layer functioning as a layer for emitting light in a quantum dot light emitting diode (QLED) display device is formed by lift-off.

CITATION LIST

Patent Literature

PTL 1: JP 2017-121787 A

Non Patent Literature

NPL 1: Bull. Chem. Soc. Jpn. 2019, 92, 952 to 960, ACS Nano 2019, 13, 4, 3823 to 3829
NPL 2: Nature 2020, 586, 385 to 389

SUMMARY

Technical Problem

When a quantum dot layer is formed by lift-off, the film thickness of the quantum dot layer may become non-uniform.

Solution to Problem

A method for manufacturing a display device according to an aspect of the disclosure includes applying a first solution containing (a) and (b) to a substrate containing an oxide,
- (a) a first functional group capable of being coordinated to the oxide,
- (b) a second functional group that is cleaved by being irradiated with ultraviolet light to generate any one of an amino group, a carboxyl group, a thiol group, and a selenol group,
- irradiating at least a part of the first solution applied to the substrate with first ultraviolet light, and applying a solution containing halogenated first quantum dots to a portion irradiated with the first ultraviolet light in the irradiating at least a part of the first solution applied to the substrate to form a first quantum dot layer.

A display device according to an aspect of the disclosure includes a substrate containing an oxide, a first bonding functional group capable of bonding to the oxide, a second bonding functional group bonded to the first bonding functional group via a carbon chain, the second bonding functional group being any one of an amino group, a carboxyl group, a thiol group, and a selenol group, and a quantum dot layer, in which the quantum dot layer includes halogen and quantum dots each bonded to the second bonding functional group and the halogen.

Advantageous Effects of Disclosure

According to an aspect of the disclosure, a film thickness of a quantum dot layer can be suppressed from becoming non-uniform.

BRIEF DESCRIPTION OF DRAWINGS

FIG. 5 is a table comparing Example, Comparative Example 1, and Comparative Example 2.

DESCRIPTION OF EMBODIMENTS

Figure 1:
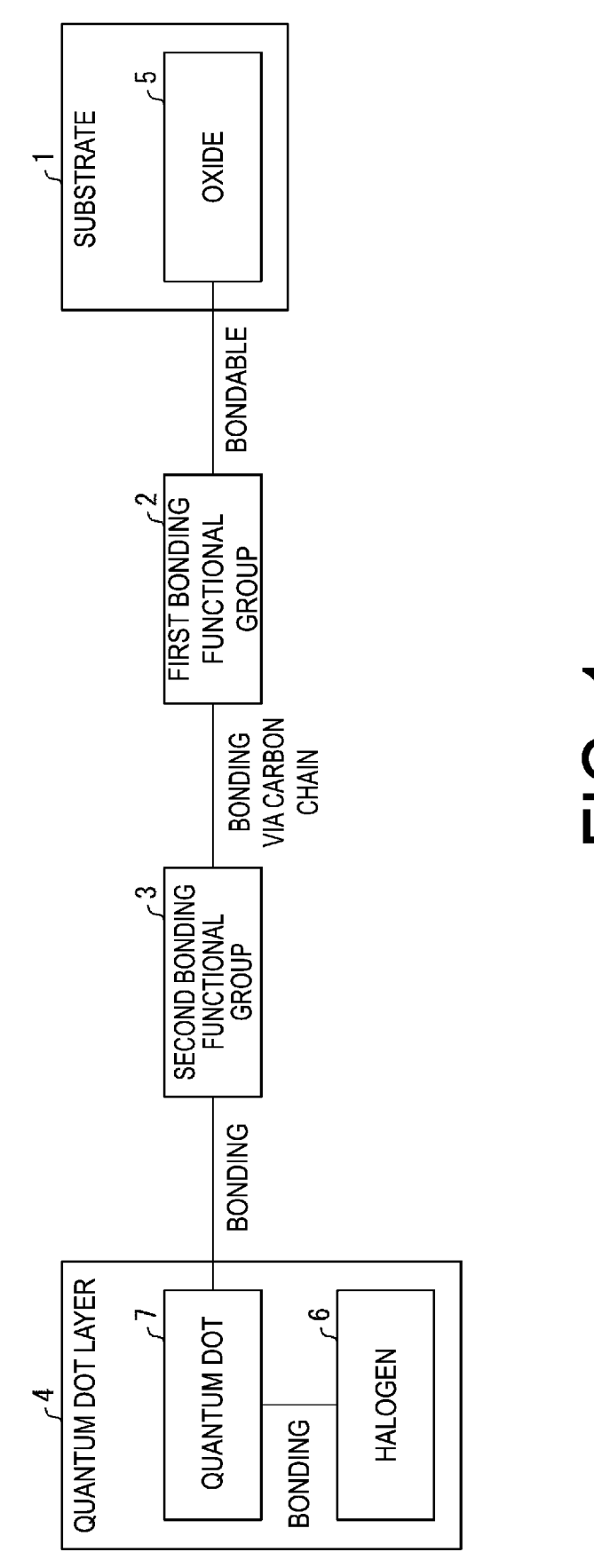
FIG. 1 is a block diagram illustrating a schematic configuration of a display device according to the disclosure.

Embodiments of the disclosure will be described below. Note that, for convenience of description, members having the same functions as the members described earlier may be denoted by the same reference numerals and signs, and the description thereof will not be repeated.

FIG. 1 is a block diagram illustrating a schematic configuration of a display device 101 according to the disclosure.

The display device 101 includes a substrate 1, a first bonding functional group 2, a second bonding functional group 3, and a quantum dot layer 4. In addition, the display device 101 includes electrodes (an anode electrode and a cathode electrode), and if necessary, a carrier transport layer (a hole transport layer and/or an electron transport layer), and the like, which are not illustrated or described because they are not closely related to the point of the disclosure.

The substrate 1 contains an oxide 5. As a specific example, the substrate 1 is a metal oxide semiconductor substrate. The substrate 1 can be constituted by forming an oxide film on a base material. Examples of the oxide 5 constituting the oxide film include zinc oxide, tin oxide, titanium oxide, indium oxide, copper oxide, molybdenum oxide, gallium oxide, nickel oxide, and a mixture of two or more of them. Examples of a method for forming the oxide film include a sputtering method, a sol-gel method, and a nanoparticle application method.

The first bonding functional group 2 is a functional group that can bond to the oxide 5 contained in the substrate 1.

The second bonding functional group 3 is a functional group bonded to the first bonding functional group 2 via a carbon chain. The second bonding functional group 3 is any one of an amino group, a carboxyl group, a thiol group, and a selenol group.

The quantum dot layer 4 functions as a layer that emits light in the QLED display device. The quantum dot layer 4 includes halogen 6 and quantum dots 7 each bonded to the second bonding functional group 3 and the halogen 6.

In the display device 101, a part of a surface of the substrate 1 may be covered with the quantum dots 7, the surface of the substrate 1 and each quantum dot 7 may be bonded to the same low molecule, and 80% or more of a surface of each of the quantum dots 7 may be covered with the halogen 6.

First Embodiment

Figure 2:
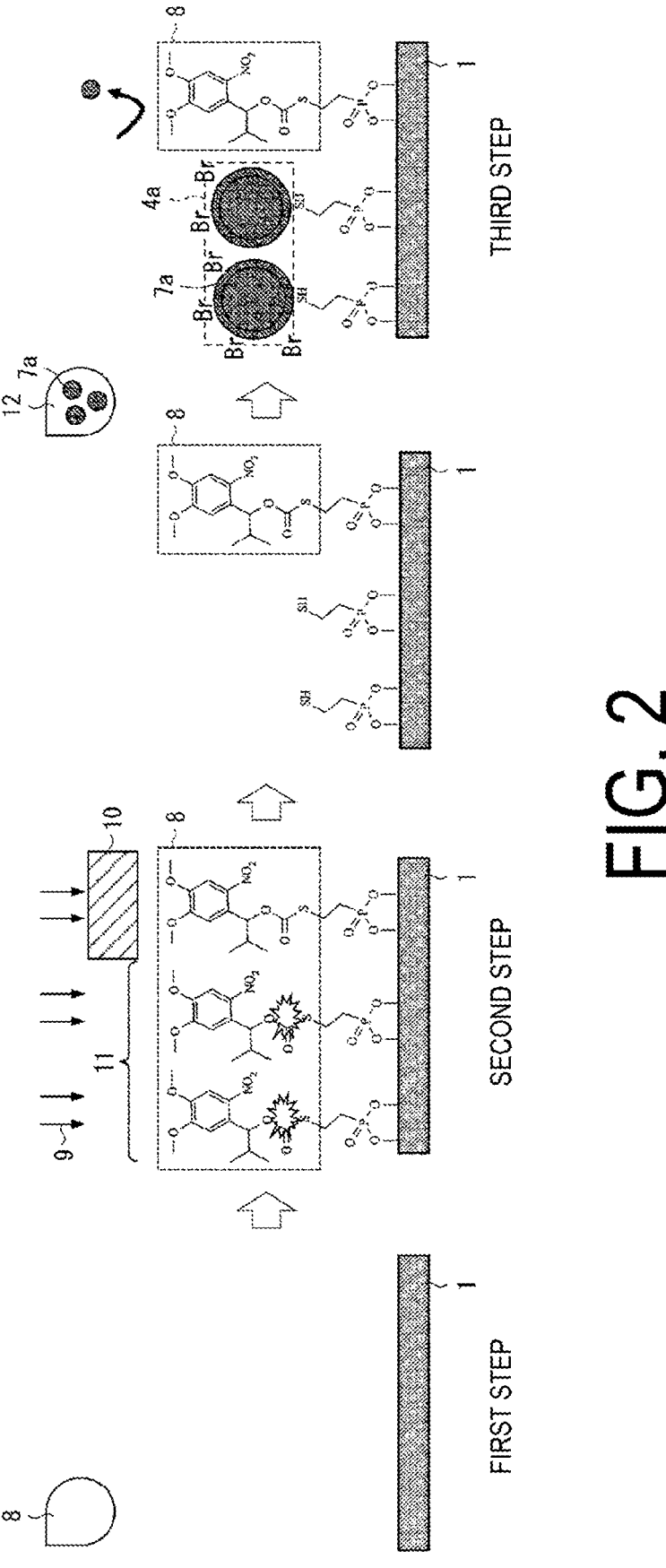
FIG. 2 is diagrams illustrating a method for manufacturing a display device according to a first embodiment of the disclosure, and illustrates a first step, a second step, and a third step.

FIG. 2 is diagrams illustrating a method for manufacturing the display device 101 according to a first embodiment of the disclosure, and illustrates a first step, a second step, and a third step.

In the first step, a first solution 8 containing (a) and (b) is applied to the substrate 1.

(a) A first functional group that can be coordinated to the oxide 5 (see FIG. 1) contained in the substrate 1

(b) A second functional group that is cleaved by being irradiated with ultraviolet light to generate any one of an amino group, a carboxyl group, a thiol group, and a selenol group The first solution 8 contains, for example, alcohol and molecules each containing the first functional group and the second functional group, and a concentration of the molecules in the first solution 8 is 0.1 mmol/l or more. Furthermore, in the first step, the substrate 1 applied with the first solution 8 is heated at 100° C. for 1 hour, and then subjected to ultrasonic cleaning in alcohol for 5 minutes, and then dried.

"Cleavage" means that a chemical bond is broken.

In the second step, at least a part of the first solution 8 applied to the substrate 1 is irradiated with first ultraviolet light 9. In FIG. 2, a part of the portion applied with the first solution 8 of the substrate 1 is covered with a photomask 10, and a first ultraviolet light irradiation area 11 that is a portion not covered with the photomask 10 is irradiated with the first ultraviolet light 9. A wave length of the first ultraviolet light 9 is, for example, 300 nm or more and 400 nm or less. Irradiation time of the first ultraviolet light irradiation area 11 with the first ultraviolet light 9 is, for example, three minutes.

After the second step, the substrate 1 is immersed in chloroform and subjected to ultrasonic cleaning for one minute.

In the third step, a solution 12 containing halogenated first quantum dots 7a is applied to a portion (first ultraviolet light irradiation area 11) irradiated with the first ultraviolet light 9 in the second step to form a first quantum dot layer 4a. In the halogenated first quantum dots 7a, for example, a surface of each of the first quantum dots 7a is halogenated. Examples of a method for applying the solution 12 to the first ultraviolet light irradiation area 11 include spin coating. Furthermore, in the third step, the substrate 1 applied with the solution 12 is allowed to stand for 10 minutes and then washed with a solvent such as acetone. The first quantum dot layer 4a and the first quantum dots 7a are included in the quantum dot layer 4 and the quantum dots 7 (see FIG. 1), respectively.

According to the above configuration, the first quantum dot layer 4a can be formed without applying lift-off, and thus the film thickness of the first quantum dot layer 4a can be suppressed from becoming non-uniform.

The first functional group preferably contains any one of a phosphonyl group, a carboxyl group, and a silanol group.

According to the above configuration, the first functional group that suitably satisfies (a) can be realized.

The second functional group preferably contains an ester bond. According to the above configuration, the second functional group that suitably satisfies (b) can be realized.

The first solution 8 preferably does not contain an organic ligand including a functional group that is coordinated to each of the halogenated first quantum dots 7a. According to the above configuration, the first quantum dot layer 4a is strongly fixed by chemical bonding to the portion irradiated with the first ultraviolet light 9 in the second step, and thus the first quantum dot layer 4a is less likely to be detached in a subsequent step.

Figure 3:
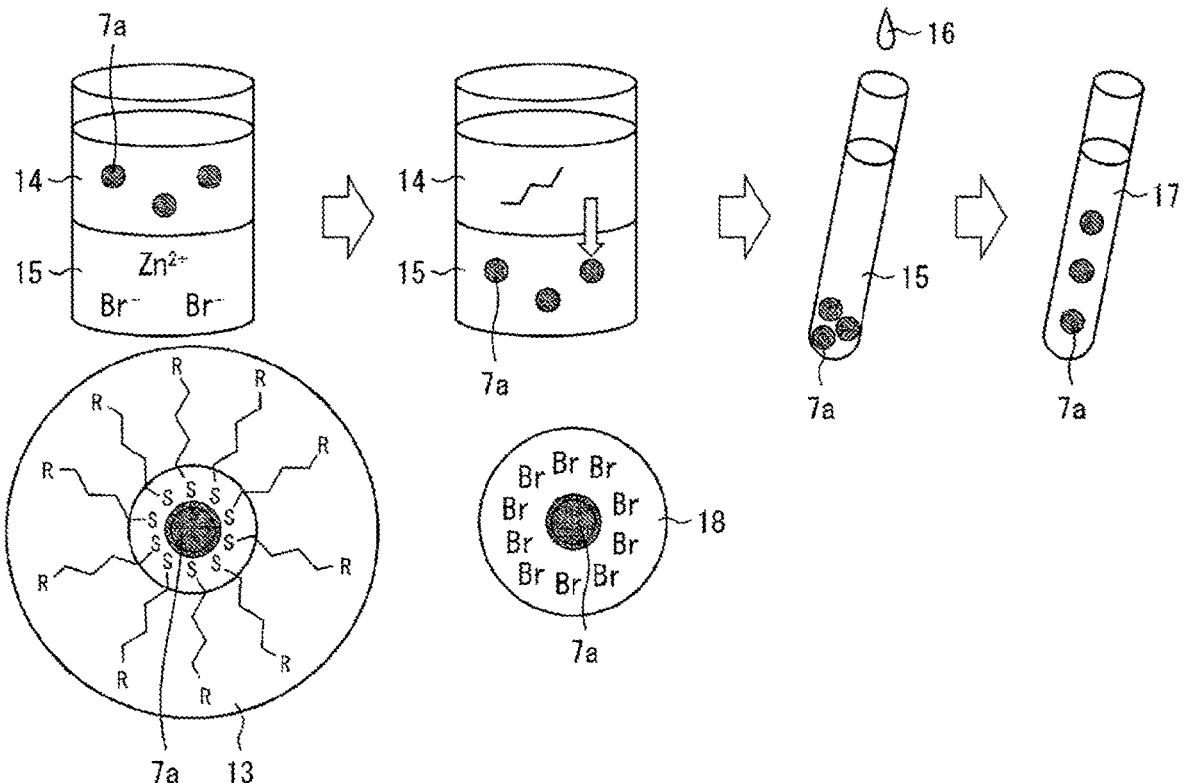
FIG. 3 is diagrams illustrating a method for producing first quantum dots each having a halogenated surface.

FIG. 3 is diagrams illustrating a method for producing first quantum dots 7a each having a halogenated surface.

First, the first quantum dots 7a each protected by a general organic ligand 13 are dispersed in a non-polar solvent to form a first liquid 14. Examples of the non-polar solvent include hexane and octane. Metal halide of 0.1 mol/l is dissolved in an aprotic polar solvent immiscible with the first liquid 14 to prepare a second liquid 15. Examples of the polar solvent include dimethyl sulfoxide (DMSO), dimethylformamide (DMF), and acetonitrile. Examples of the metal halide include zinc bromide.

Subsequently, the first liquid 14 and the second liquid 15 are mixed and stirred while being separated from each other. The stirring time is, for example, 12 hours. After confirming that the first quantum dots 7a have moved from the first liquid 14 side to the second liquid 15 side, a non-polar solvent 16 miscible with the second liquid 15 is added to the second liquid 15 to precipitate the first quantum dots 7a. Examples of the non-polar solvent 16 include toluene and ethyl acetate. By being dispersed in a polar solvent 17, the first quantum dots 7a each having the halogenated surface are obtained. Examples of the polar solvent 17 include DMSO and DMF. In other words, the first quantum dots 7a each having the halogenated surface are the first quantum dots 7a each protected by a halogen ligand 18.

That is, it is preferable that (1) the first liquid 14 in which the first quantum dots 7a each coordinated with the organic ligand 13 are dispersed in a non-polar solvent and (2) the second liquid 15 immiscible with the first liquid 14 and containing the aprotic polar solvent and the metal halide be mixed, and the halogenated first quantum dots 7a be taken out from the liquid obtained by mixing the first liquid 14 and the second liquid 15. According to the above configuration, the halogenated first quantum dots 7a can be produced.

Note that the first solution 8 contains, in addition to the first functional group and the second functional group, a third functional group required for absorbing the ultraviolet light.

Figure 4:
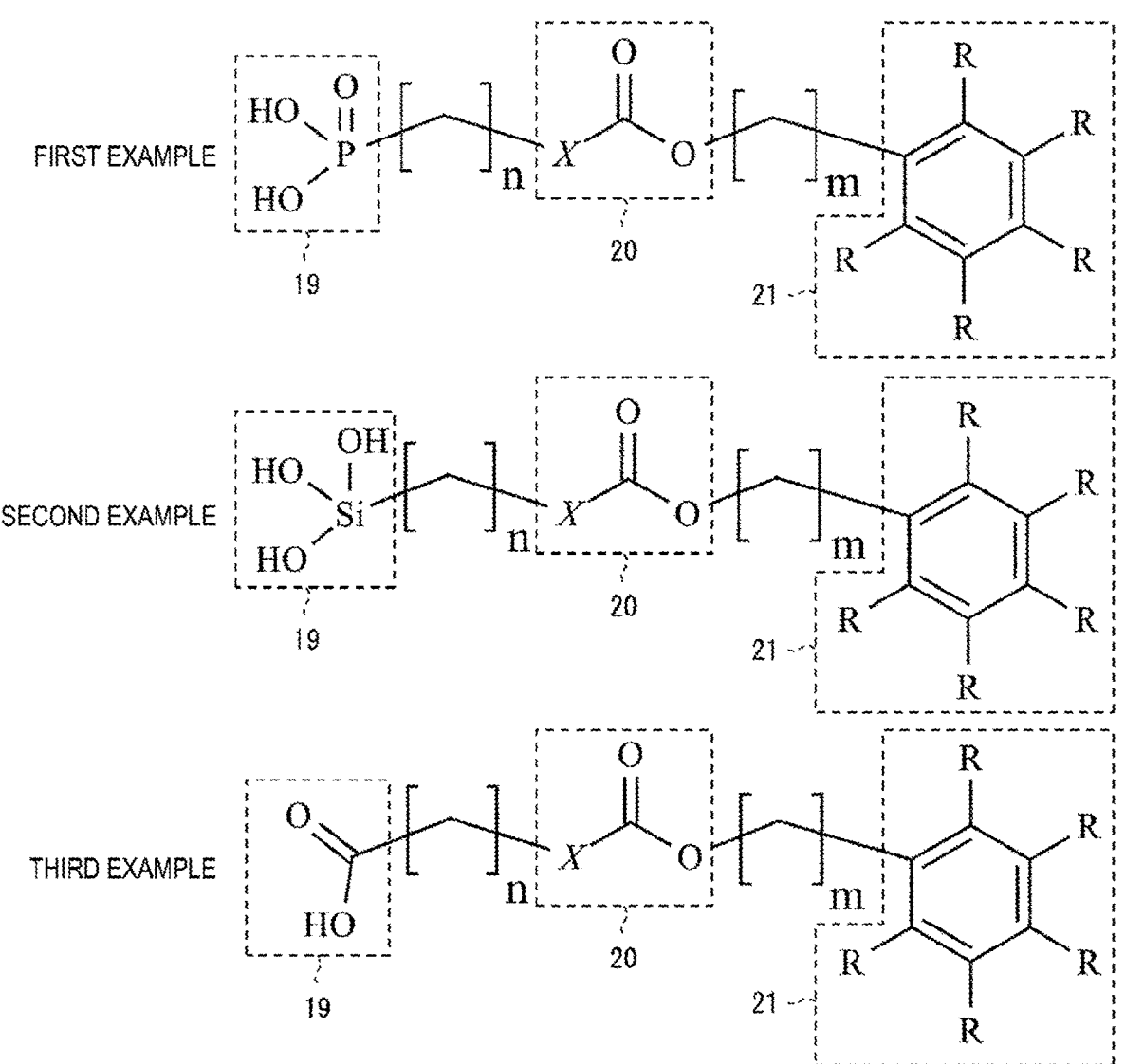
FIG. 4 is diagrams illustrating a first example, a second example, and a third example of a combination of a first functional group, a second functional group, and a third functional group contained in a first solution.

FIG. 4 is diagrams illustrating a first example, a second example, and a third example of a combination of a first functional group 19, a second functional group 20, and a third functional group 21 contained in the first solution 8.

In each example in FIG. 4, in the first solution 8, the first functional group 19, the second functional group 20, and the third functional group 21 are bonded to each other via an alkyl chain. The alkyl chain may be branched. In each example in FIG. 4, the following can be said.

n: 1 or more and 10 or less m: 1 or more and 2 or less

X: oxygen atom (O), sulfur atom(S), NH, or $CH_2$

R: a functional group selected from hydrogen, fluorine, an alkyl group, a phenyl group, a hydroxyl group, an alkoxy group, a nitro group, a cyano group, an amino group, and a sulfonyl group Depending on a structure of the third functional group 21, a wavelength of the ultraviolet light that can be absorbed by the third functional group 21 can be controlled.

A patterning method of the display device 101 may be a method in which the first solution 8 coordinated to the substrate 1 and having a part of molecular structure being decomposed to expose any one of the thiol group, the carboxyl group, and the amino group when irradiated with the first ultraviolet light 9 is applied to the entirety of the substrate 1, only a part of the substrate 1 is irradiated with the first ultraviolet light 9, the solution 12 containing the first quantum dots 7a having the surface covered with the halogen 6 (see FIG. 1) by 80% or more is applied to the entirety of the substrate 1, and the first quantum dots 7a are deposited only on the portion irradiated with the first ultraviolet light 9.

Hereinafter, the significance of halogenating the surface of each of the quantum dots will be discussed.

It was confirmed by the following method that the quantum dots each having the surface covered with halogen rapidly underwent ligand exchange.

CdSe/ZnS quantum dots covered with oleic acid were prepared so as to obtain a hexane solution of 2 mg/ml. A DMSO solution of zinc bromide of 0.2 mol/ml and ammonium acetate of 0.01 mol/ml were prepared. When these were mixed in equal amounts, the mixture was separated into two layers, but when the mixture was vigorously stirred for a certain period of time (for example, 12 hours), the quantum dots moved to the DMSO solution side that was a lower layer. Impurities were removed by precipitating the quantum dots by adding ethyl acetate and toluene dropwise to the DMSO solution. A solution in which the quantum dots each having the surface almost entirely covered with bromide ions were dispersed in the polar solvent was obtained by dispersing the precipitate in DMF.

FIG. 5 is a table comparing Example, Comparative Example 1, and Comparative Example 2. FIG. 5 also illustrates chemical formulae of dodecylamine and diethylaminoethanethiol.

The quantum dots can be either polar or non-polar depending on the ligand on the surface of each of the quantum dots. However, when the quantum dots are coordinated to the substrate on which thiol or the like is exposed, the non-polar quantum dots dispersed in the non-polar solvent cannot be coordinated to the substrate because the solution is repelled by a highly hydrophilic substrate on which a functional group having polarity is exposed. Thus, the quantum dots according to the disclosure need to be dispersed in a solvent having high polarity.

In order to produce quantum dots each having an exposed polar plane that is dissolved in the polar solvent, a ligand can be applied that is coordinated to each of the quantum dots and allow the quantum dots to be dissolved in the polar solvent. Examples of the ligand include halogen, a sulfide ion, and diethylaminoethanethiol that is an organic ligand having high polarity. Their applicability to the quantum dots will be confirmed. In the table in FIG. 5, an example in which the ligand coordinated to each of the quantum dots is halogen is shown as Example, an example in which the ligand coordinated to each of the quantum dots is a sulfide ion is shown as Comparative Example 1, and an example in which the ligand coordinated to each of the quantum dots is diethylaminoethanethiol is shown as Comparative Example 2 (see columns of compounds on a quantum dot surface). In addition, FIG. 5 shows raw materials of the ligands in the examples, respectively (see columns of the raw materials).

In Example, zinc bromide was dissolved in a DMF solvent to finally obtain quantum dots subjected to ligand substitution with bromine ions, and the quantum dots were dispersed in DMF. On the other hand, in Comparative Examples 1 and 2, sodium sulfide and diethylaminoethanethiol were dissolved in DMF, respectively, instead of zinc bromide in Example, and each of the compounds described in the columns of compounds on the quantum dot surface was finally coordinated to each of the quantum dots and dispersed in DMF.

When dodecylamine is dissolved in octane that is a non-polar solvent and stirred while being separated from the DMF solution of the quantum dots into two layers (DMF in the lower layer and octane in the upper layer), each ligand is substituted by dodecylamine, and thus the quantum dots exhibit non-polarity. As a result, the quantum dots move to the octane side that is the upper layer. The ease of substitution of each ligand with the organic ligand can be quantified from time until the quantum dots completely move to the octane side. The time until the quantum dots completely move to the octane side is shown in columns of time until the quantum dots move to a hydrophobic layer containing the organic ligand in FIG. 5.

The quantum dots coordinated with bromide ions completely moved to the octane side in 10 seconds, whereas the quantum dots coordinated with sulfide ions did not move and the quantum dots coordinated with diethylaminoethanethiol took 12 hours to move. Accordingly, the ease of substitution of each ligand with the organic ligand is considered to be in the following order.

Halogen>Organic ligand exhibiting polarity when coordinated to each of the quantum dots>Sulfide ion A reaction rate in the solution is also related to a reaction rate with the organic ligand on the oxide substrate, and thus the quantum dots are rapidly fixed to the substrate in Example. Thus, Example is considered to be suitable.

As a method for preparing a display device patterned by a solution process, there are an ink-jet method in which a solution is applied only to a specific portion and a photolithography method. The inkjet method has a limit in definition, and thus it is not suitable for a display device requiring high definition. The photolithography method enables high definition, and thus QLED display devices using various methods have been studied. As a method for manufacturing a QLED display device using the photolithography method, there is a method in which a photoresist that is cured by light irradiation and the quantum dots are mixed and cured. However, in this method, a ratio of a resist material in the quantum dot layer is large, and thus luminous efficiency and durability of the quantum dot layer are low. There is also known a method in which the photoresist is patterned on a sacrificial layer, a hole is formed in a part of the sacrificial layer by plasma etching, the quantum dots are applying to the entire surface, and then the sacrificial layer is dissolved and removed with a solution, and thus the quantum dot layer is patterned. However, in this method, there is a problem that the thickness of the quantum dot layer becomes non-uniform, and the removed quantum dots and the sacrificial layer are mixed in the same solvent, and thus it is difficult to reuse the quantum dots, and the material utilization efficiency is low.

Thus, in the present method, by patterning the substrate side with light, the quantum dots are coordinated to only a part, and other impurities are not contained in the removed quantum dot solution, and thus the quantum dots can be reused and the material utilization efficiency is high. Further, since the patterning is performed by the light irradiation, the high definition can be achieved.

According to the present embodiment, the substrate is covered with a monomolecular film that exposes a functional group to which the quantum dots are coordinated by the light irradiation. Most (80% or more) of the surface of each of the quantum dots in the solution is covered with halogen, and thus the quantum dots are rapidly coordinated to the substrate.

According to the present embodiment, it is possible to solve the problems that the light emission is adversely affected by the contact between the photoresist and the quantum dots and the photoresist remains on the substrate.

There is known a technique of patterning a monomolecular film having a photocleavable structure by chemically modifying the monomolecular film with a fluorescent substance (see NPL 1). However, an application in which the fluorescent substance is simply replaced with the quantum dots with respect to the technique is difficult. This is because the quantum dots are each usually covered with the organic ligand and thus dissolved in the non-polar solvent, and the surface exposed by cleavage is polar, and thus wettability of the polar surface with the non-polar solvent is not good, which causes a problem that the quantum dots cannot be applied well. Thus, it is effective to make the quantum dots soluble in the polar solvent by substituting halogen for the organic ligand of the quantum dots so that the quantum dots can be applied.

A method is known in which halogen is substituted for a part of the quantum dot surface covered with the organic ligand and the substituted quantum dots are dispersed in the non-polar solvent (see NPL 2). However, when 80% or more of the quantum dot surface is modified with halogen by the above-described method or the like, the quantum dots are easily dissolved in the polar solvent.

Second Embodiment

Figure 6:
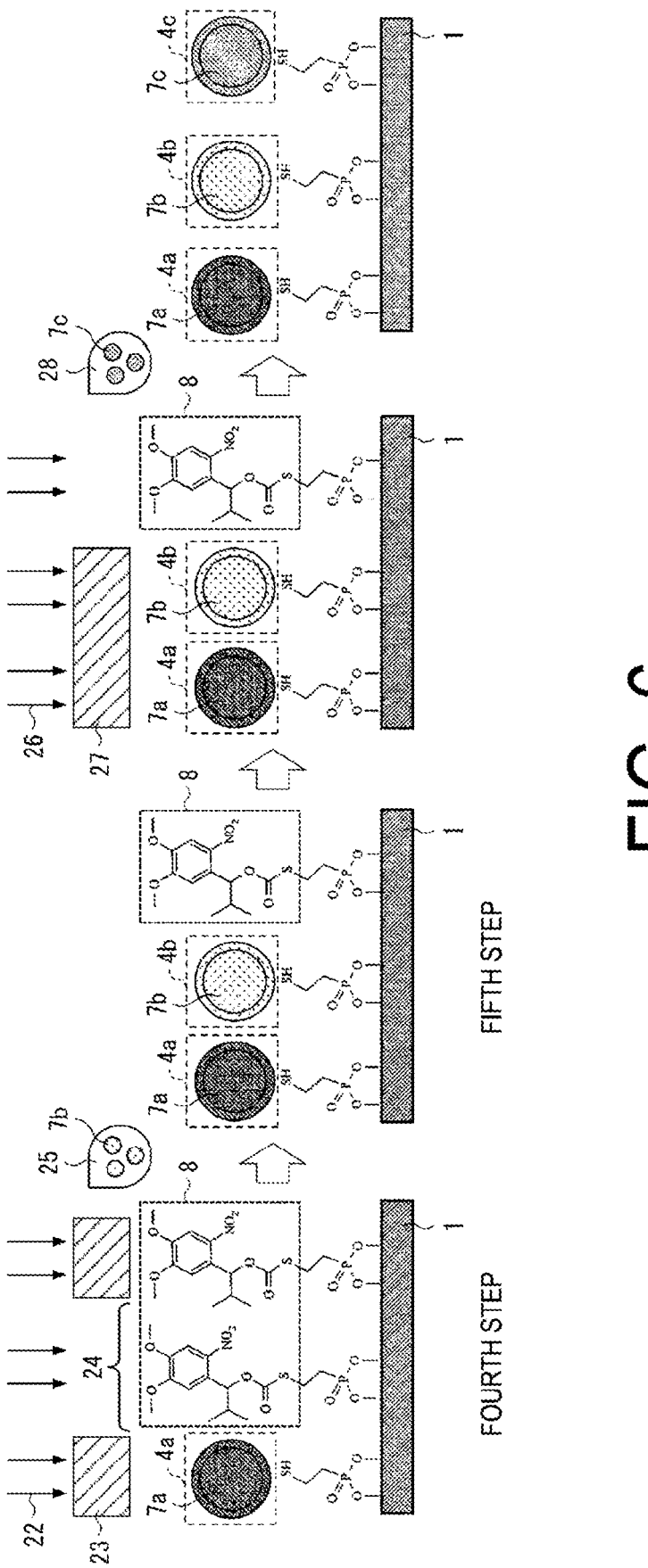
FIG. 6 is diagrams illustrating a method for manufacturing a display device according to a second embodiment of the disclosure, and illustrates a fourth step and a fifth step.

FIG. 6 is diagrams illustrating a method for manufacturing the display device 101 according to a second embodiment of the disclosure, and illustrates a fourth step and a fifth step.

The fourth step is a step after the third step (see FIG. 2). In the fourth step, a portion that is at least a part of the first solution 8 applied to the substrate 1 and not irradiated with the first ultraviolet light 9 is irradiated with second ultraviolet light 22. In FIG. 6, among the portion of the substrate 1 applied with the first solution 8, the portion irradiated with the first ultraviolet light 9 (thus, the portion where the first quantum dot layer 4a is formed) and a part of the portion not irradiated with the first ultraviolet light 9 (thus, the portion where the first quantum dot layer 4a is not formed) are covered with a photomask 23, and a second ultraviolet light irradiation area 24 that is a portion not covered with the photomask 23 is irradiated with the second ultraviolet light 22. A wave length of the second ultraviolet light 22 is, for example, 300 nm or more and 400 nm or less. Irradiation time of the second ultraviolet light irradiation area 24 with the second ultraviolet light 22 is, for example, three minutes.

In the fifth step, a solution 25 containing halogenated second quantum dots 7b is applied to a portion (second ultraviolet light irradiation area 24) irradiated with the second ultraviolet light 22 in the fourth step to form a second quantum dot layer 4b. In the halogenated second quantum dots 7b, for example, a surface of each of the second quantum dots 7b is halogenated. Examples of a method for applying the solution 25 to the second ultraviolet light irradiation area 24 include spin coating. The second quantum dot layer 4b and the second quantum dots 7b are included in the quantum dot layer 4 and the quantum dots 7 (see FIG. 1), respectively.

According to the above configuration, the first quantum dot layer 4a and the second quantum dot layer 4b can be separately formed, and thus the first quantum dots 7a and the second quantum dots 7b can be separately patterned.

In FIG. 6, the following steps are further performed after the fifth step. That is, a portion that is at least a part of the first solution 8 applied to the substrate 1 and is not irradiated with any of the first ultraviolet light 9 and the second ultraviolet light 22 is irradiated with third ultraviolet light 26 by using a photomask 27. Then, a solution 28 containing halogenated third quantum dots 7c is applied to a portion irradiated with the third ultraviolet light 26 to form a third quantum dot layer 4c. In the halogenated third quantum dots 7c, for example, a surface of each of the third quantum dots 7c is halogenated. The third quantum dot layer 4c and the third quantum dots 7c are included in the quantum dot layer 4 and the quantum dots 7 (see FIG. 1), respectively.

Third Embodiment

Figure 7:
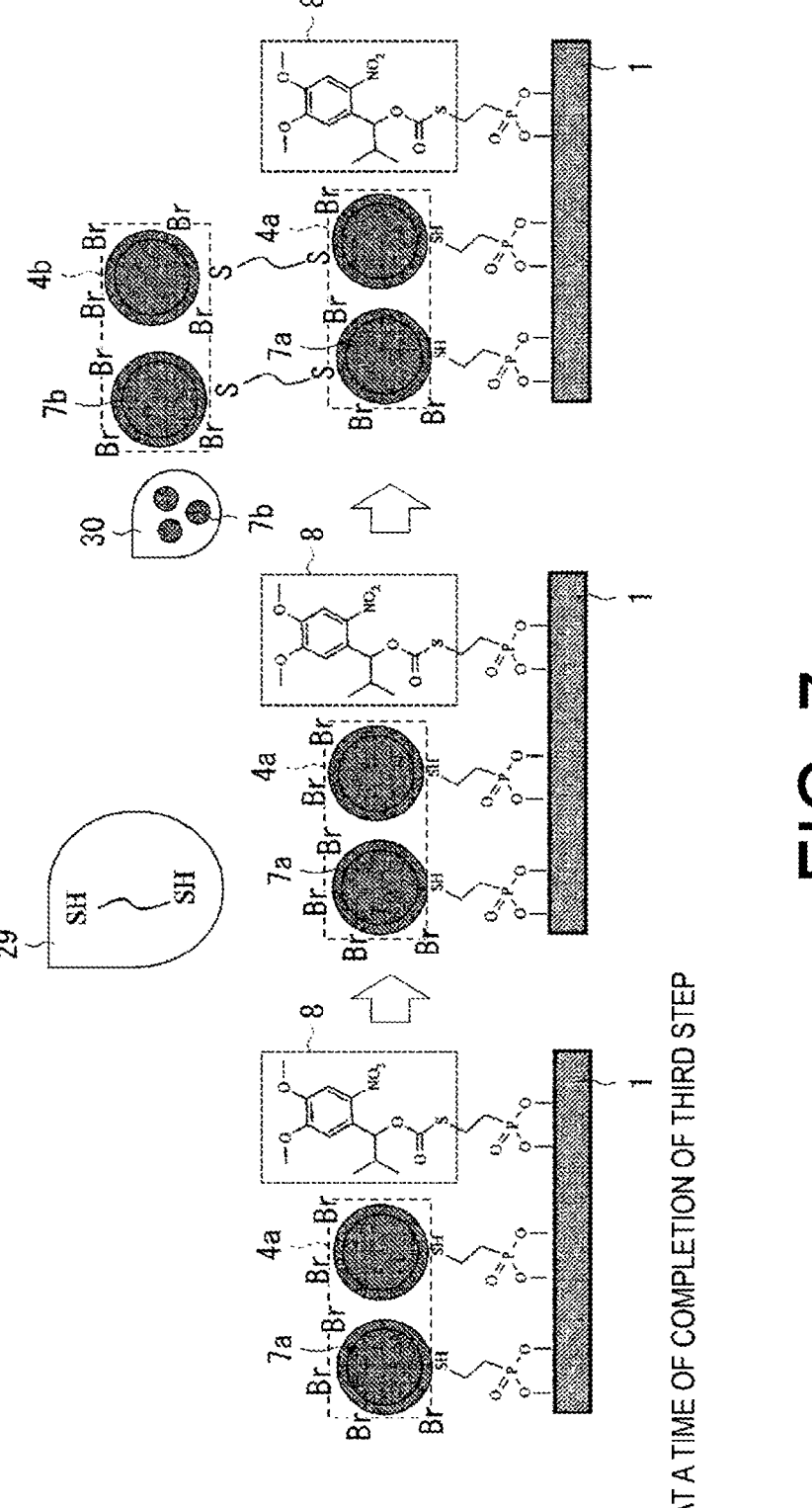
FIG. 7 is diagrams illustrating a method for manufacturing a display device according to a third embodiment of the disclosure.

FIG. 7 is diagrams illustrating a method for manufacturing the display device 101 according to a third embodiment of the disclosure.

After the third step, a second solution 29 containing (A) the halogenated first quantum dots 7a constituting the first quantum dot layer 4a and (B) a functional group that can be coordinated to each of the halogenated second quantum dots 7b may be applied to at least the first quantum dot layer 4a, and a solution 30 containing the halogenated second quantum dots 7b may be applied to a portion where the second solution 29 is applied to the first quantum dot layer 4a to form the second quantum dot layer 4b.

According to the above configuration, when a layered structure of the first quantum dot layer 4a and the second quantum dot layer 4b is formed, the first quantum dots 7a constituting the first quantum dot layer 4a can be prevented from being detached from the substrate 1. When a material of the first quantum dots 7a and a material of the second quantum dots 7b are the same, the layered structure is suitable for forming a quantum dot layer (corresponding to the layered structure) having a large film thickness.

Examples of the second solution 29 include an organic ligand solution, typified by ethanedithiol, including two or more functional groups that can be coordinated to two or more quantum dot surfaces.

In the display device 101 according to the present embodiment, an interval between the first quantum dots 7a and the second quantum dots 7b is preferably 3 nm or less. The length of the organic ligand contained in the second solution 29 is preferably 20 carbon atoms or less, and more preferably 10 carbon atoms or less.

In the above, the example is described in which the quantum dot layer 4 (see FIG. 1) is formed as the layered structure of two layers. On the other hand, the quantum dot layer 4 may be formed as a layered structure of three or more layers by repeating the steps according to the present embodiment.

Fourth Embodiment

Figure 8:
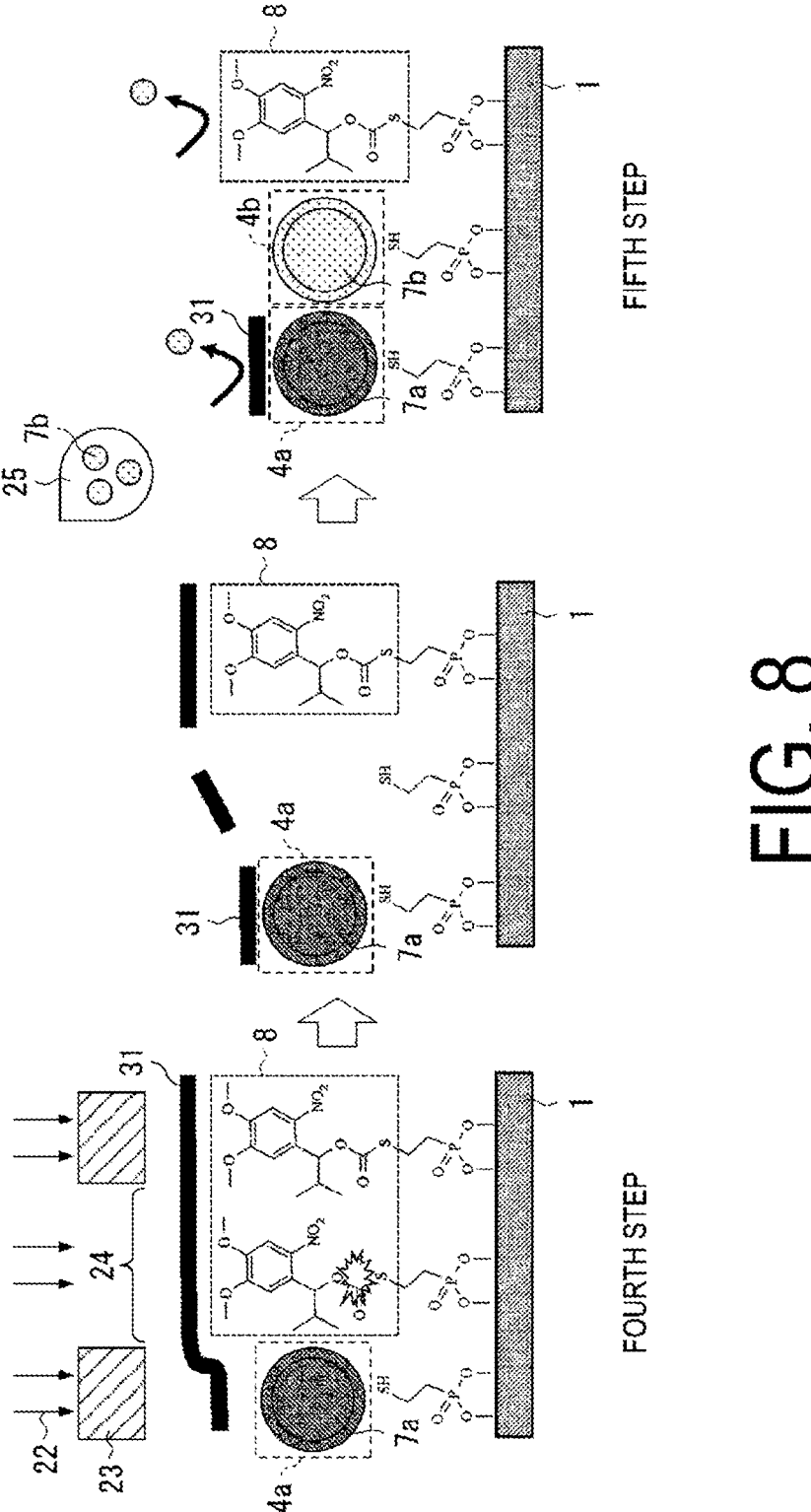
FIG. 8 is a diagram illustrating a method for manufacturing a display device according to a fourth embodiment of the disclosure.

FIG. 8 is diagrams illustrating a method for manufacturing the display device 101 according to a fourth embodiment of the disclosure.

Before the fifth step, a detachment preventing agent 31 for preventing the first quantum dots 7a from being detached from the substrate 1 may be applied to at least the first quantum dot layer 4a. Here, the detachment preventing agent 31 is applied before the fourth step.

According to the above configuration, when the second quantum dot layer 4b is formed, the first quantum dots 7a constituting the first quantum dot layer 4a can be prevented from being detached from the substrate 1.

Examples of the detachment preventing agent 31 include a hydrophobic polymer. The hydrophobic polymer may be an insulator or may have a carrier transport property.

When the detachment preventing agent 31 is applied before the fourth step, the detachment preventing agent 31 is preferably peeled off from the substrate 1 by being irradiated with the second ultraviolet light 22 in the fourth step. In this case, it is preferable that the detachment preventing agent 31 can be washed away from the substrate 1 by washing the substrate 1 with a solvent after the peel off.

Fifth Embodiment

Figure 9:
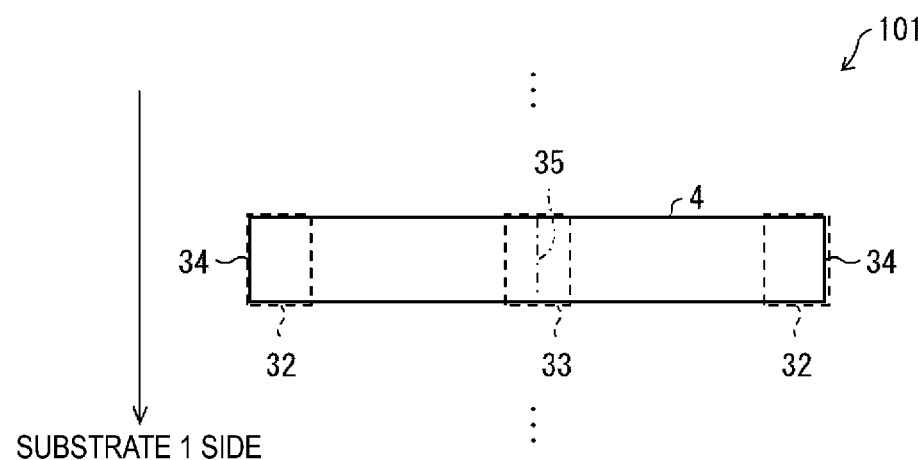
FIG. 9 is a schematic view illustrating a cross section of a quantum dot layer of a display device according to a fifth embodiment of the disclosure.

FIG. 9 is a schematic view illustrating a cross section of the quantum dot layer 4 of the display device 101.

In the display device 101 manufactured by the method for manufacturing the display device 101 according to each of the embodiments described above, an average film thickness of an end portion 32 of the quantum dot layer 4 can be 80% or more and 120% or less of an average film thickness of a central portion 33 of the quantum dot layer 4. According to the above configuration, the display device 101 is a display device in which the film thickness of the quantum dot layer 4 is uniform.

Referring to the cross section of the quantum dot layer 4 illustrated in FIG. 9, the end portion 32 and the central portion 33 of the quantum dot layer 4 can be defined as follows, for example. The end portion 32 of the quantum dot layer 4 is a portion within 100 nm in a direction from an outer edge 34 of the quantum dot layer 4 toward a center 35 of the quantum dot layer 4. The central portion 33 of the quantum dot layer 4 is a portion within 50 nm in a direction from the center 35 of the quantum dot layer 4 toward the outer edge 34 of the quantum dot layer 4.

The average film thickness of the end portion 32 of the quantum dot layer 4 is obtained by selecting two or more measurement points from the end portion 32 of the quantum dot layer 4, measuring the film thickness at each measurement point with a cross-sectional transmission electron microscopy (TEM), and addition-averaging the measurement results. The average film thickness of the central portion 33 of the quantum dot layer 4 is obtained by selecting two or more measurement points from the central portion 33 of the quantum dot layer 4, measuring the film thickness at each measurement point with a cross-sectional TEM, and addition-averaging the measurement results.

Supplement

A method for manufacturing a display device according to a first aspect of the disclosure includes applying a first solution containing (a) and (b) to a substrate containing an oxide, (a) a first functional group capable of being coordinated to the oxide, (b) a second functional group that is cleaved by being irradiated with ultraviolet light to generate any one of an amino group, a carboxyl group, a thiol group, and a selenol group, irradiating at least a part of the first solution applied to the substrate with first ultraviolet light, and applying a solution containing halogenated first quantum dots to a portion irradiated with the first ultraviolet light in the irradiating at least a part of the first solution applied to the substrate to form a first quantum dot layer.

According to the above configuration, the first quantum dot layer can be formed without applying lift-off, and thus the film thickness of the first quantum dot layer can be suppressed from becoming non-uniform.

In the method for manufacturing a display device according to a second aspect of the disclosure, according to the first aspect, the first functional group contains any one of a phosphonyl group, a carboxyl group, and a silanol group.

According to the above configuration, the first functional group that suitably satisfies (a) can be realized.

In the method for manufacturing a display device according to a third aspect of the disclosure, according to the first or second aspect, the second functional group contains an ester bond.

According to the above configuration, the second functional group that suitably satisfies (b) can be realized.

In the method for manufacturing a display device according to a fourth aspect of the disclosure, according to any one of the first to third aspects, the first solution does not contain an organic ligand including a functional group that is coordinated to each of the halogenated first quantum dots.

According to the above configuration, the first quantum dot layer is strongly fixed to the portion irradiated with the first ultraviolet light in the irradiating at least a part of the first solution applied to the substrate, and thus the first quantum dot layer is less likely to be detached in a subsequent step.

In the method for manufacturing a display device according to a fifth aspect of the disclosure, according to any one of the first to fourth aspects, (1) a first liquid in which first quantum dots each coordinated with an organic ligand are dispersed in a non-polar solvent and (2) a second liquid immiscible with the first liquid and containing an aprotic polar solvent and metal halide are mixed, and the halogenated first quantum dots are taken out from a liquid obtained by mixing the first liquid and the second liquid.

According to the above configuration, the halogenated first quantum dots can be produced.

The method for manufacturing a display device according to a sixth aspect of the disclosure, according to any one of the first to fifth aspects, further includes irradiating a portion that is at least a part of the first solution applied to the substrate and is not irradiated with the first ultraviolet light with second ultraviolet light after the applying a solution containing halogenated first quantum dots, and applying a solution containing halogenated second quantum dots to the portion irradiated with the second ultraviolet light in the irradiating a portion that is at least a part of the first solution applied to the substrate and is not irradiated with the first ultraviolet light to form a second quantum dot layer.

According to the above configuration, the first quantum dot layer and the second quantum dot layer can be separately formed, and thus the first quantum dots and the second quantum dots can be separately patterned.

In the method for manufacturing a display device according to a seventh aspect of the disclosure, according to the sixth aspect, before the applying a solution containing halogenated second quantum dots, a detachment preventing agent for preventing the halogenated first quantum dots from being detached from the substrate is applied to at least the first quantum dot layer.

According to the above configuration, when the second quantum dot layer is formed, the first quantum dots constituting the first quantum dot layer can be prevented from being detached from the substrate.

In the method for manufacturing a display device according to an eighth aspect of the disclosure, according to any one of the first to seventh aspects, after the applying a solution containing halogenated first quantum dots, a second solution containing (A) the halogenated first quantum dots constituting the first quantum dot layer and (B) a functional group capable of being coordinated to each of the halogenated second quantum dots are applied to at least the first quantum dot layer, and a solution containing the halogenated second quantum dots is applied to a portion where the second solution is applied to the first quantum dot layer to form a second quantum dot layer.

According to the above configuration, when a layered structure of the first quantum dot layer and the second quantum dot layer formed, the first quantum dots constituting the first quantum dot layer can be prevented from being detached from the substrate. When a material of the first quantum dots and a material of the second quantum dots are the same, the layered structure is suitable for forming a quantum dot layer (corresponding to the layered structure) having a large film thickness.

A display device according to a ninth aspect of the disclosure includes a substrate containing an oxide, a first bonding functional group capable of bonding to the oxide, a second bonding functional group bonded to the first bonding functional group via a carbon chain, the second bonding functional group being any one of an amino group, a carboxyl group, a thiol group, and a selenol group, and a quantum dot layer, in which the quantum dot layer includes halogen and quantum dots each bonded to the second bonding functional group and the halogen.

According to the above configuration, the quantum dot layer can be formed without applying lift-off, and thus a display device in which a film thickness of the quantum dot layer is uniform.

In the method for manufacturing a display device according to a tenth aspect of the disclosure, according to the ninth aspect, an average film thickness of an end portion of the quantum dot layer is 80% or more and 120% or less of an average film thickness of a central portion of the quantum dot layer.

According to the above configuration, the display device is a display device in which the film thickness of the quantum dot layer is uniform.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A method for manufacturing a display device comprising:

applying a first solution containing (a) and (b) to a substrate containing an oxide, (a) a first functional group capable of being coordinated to the oxide, (b) a second functional group that is cleaved by being irradiated with ultraviolet light to generate any one of an amino group, a carboxyl group, a thiol group, and a selenol group;

irradiating at least a part of the first solution applied to the substrate with first ultraviolet light; and applying a solution containing halogenated first quantum dots to a portion irradiated with the first ultraviolet light in the irradiating at least a part of the first solution applied to the substrate to form a first quantum dot layer.

2. The method for manufacturing a display device according to claim 1, wherein the first functional group contains any one of a phosphonyl group, a carboxyl group, and a silanol group.

3. The method for manufacturing a display device according to claim 1, wherein the second functional group contains an ester bond.

4. The method for manufacturing a display device according to claim 1, wherein the first solution does not contain an organic ligand including a functional group capable of being coordinated to each of the halogenated first quantum dots.

5. The method for manufacturing a display device according to claim 1, wherein (1) a first liquid in which first quantum dots each coordinated with an organic ligand are dispersed in a non-polar solvent and (2) a second liquid immiscible with the first liquid and containing an aprotic polar solvent and metal halide are mixed, and the halogenated first quantum dots are taken out from a liquid obtained by mixing the first liquid and the second liquid.

6. The method for manufacturing a display device according to claim 1, the method further comprising:

irradiating a portion that is at least a part of the first solution applied to the substrate and is not irradiated with the first ultraviolet light with second ultraviolet light after the applying a solution containing halogenated first quantum dots, and applying a solution containing halogenated second quantum dots to the portion irradiated with the second ultraviolet light in the irradiating a portion that is at least a part of the first solution applied to the substrate and is not irradiated with the first ultraviolet light to form a second quantum dot layer.

7. The method for manufacturing a display device according to claim 6, wherein, before the applying a solution containing halogenated second quantum dots, a detachment preventing agent for preventing the halogenated first quantum dots from being detached from the substrate is applied to at least the first quantum dot layer.

8. The method for manufacturing a display device according to claim 1, wherein after the applying a solution containing halogenated first quantum dots, a second solution containing (A) the halogenated first quantum dots constituting the first quantum dot layer and (B) a functional group capable of being coordinated to each of the halogenated second quantum dots are applied to at least the first quantum dot layer, and a solution containing the halogenated second quantum dots is applied to a portion where the second solution is applied to the first quantum dot layer to form a second quantum dot layer.

9. A display device comprising:

a substrate containing an oxide;

a first bonding functional group capable of bonding to the oxide;

a second bonding functional group bonded to the first bonding functional group via a carbon chain, the second bonding functional group being any one of an amino group, a carboxyl group, a thiol group, and a selenol group; and a quantum dot layer, wherein the quantum dot layer includes halogen and quantum dots each bonded to the second bonding functional group and the halogen.

10. The display device according to claim 9, wherein an average film thickness of an end portion of the quantum dot layer is 80% or more and 120% or less of an average film thickness of a central portion of the quantum dot layer.

\* \* \* \* \*